United States Patent
Sequeira, Jr. et al.

(10) Patent No.: US 9,593,558 B2
(45) Date of Patent: Mar. 14, 2017

(54) SYSTEM AND METHOD FOR PLANNING A WELL PATH

(75) Inventors: Jose J. Sequeira, Jr., The Woodlands, TX (US); Yao-Chou Cheng, Houston, TX (US); Rune Musum, Stavanger (NO)

(73) Assignee: ExxonMobil Upstream Research Company, Spring, TX (US)

( * ) Notice: Subject to any disclaimer, the term of this patent is extended or adjusted under 35 U.S.C. 154(b) by 459 days.

(21) Appl. No.: 13/811,828

(22) PCT Filed: Jun. 29, 2011

(86) PCT No.: PCT/US2011/042403
§ 371 (c)(1),
(2), (4) Date: Jan. 23, 2013

(87) PCT Pub. No.: WO2012/027020
PCT Pub. Date: Mar. 1, 2012

(65) Prior Publication Data
US 2013/0140037 A1    Jun. 6, 2013

Related U.S. Application Data

(60) Provisional application No. 61/376,539, filed on Aug. 24, 2010.

(51) Int. Cl.
*E21B 41/00* (2006.01)
*E21B 7/04* (2006.01)
(Continued)

(52) U.S. Cl.
CPC ............ *E21B 41/0092* (2013.01); *E21B 7/04* (2013.01); *E21B 43/00* (2013.01); *E21B 47/022* (2013.01)

(58) Field of Classification Search
CPC ........ E21B 41/0092; E21B 7/04; E21B 43/00; E21B 47/022
See application file for complete search history.

(56) References Cited

U.S. PATENT DOCUMENTS 5,468,088 A   11/1995   Shoemaker et al.
5,708,764 A   1/1998    Borrel et al.
(Continued)

FOREIGN PATENT DOCUMENTS

WO    WO 00/14574      3/2000
WO    WO 2005/071222   8/2005
(Continued)

OTHER PUBLICATIONS

Adamson, G. et al. (1996), "Simulation Throughout the Life of a Reservoir," *Oilfield Review*, pp. 16-27.
(Continued)

*Primary Examiner* — Yong-Suk (Philip) Ro
(74) *Attorney, Agent, or Firm* — ExxonMobil Upstream Research Company-Law Department

(57) ABSTRACT

A system and method for planning a well path is described. An exemplary method comprises defining a proxy constraint volume as a three-dimensional (3D) cellular volume where each cell has at least one value derived from data from a 3D earth model. An initial well path is defined within user defined drilling parameter constraints. The exemplary method comprises defining acceptable constraint parameters to be applied to values derived from an intersection of the initial well path and the proxy constraint volume. If the intersection of the initial well path and the proxy constraint volume is not within the acceptable constraint parameters, the initial well path may be iteratively adjusted to create successive well paths until at least one of the successive well paths is within the acceptable constraint parameters for the (Continued)

values derived from the intersection of the well path and proxy constraint volume.

20 Claims, 9 Drawing Sheets

(51) Int. Cl.
*E21B 43/00* (2006.01)
*E21B 47/022* (2012.01)

(56) References Cited

U.S. PATENT DOCUMENTS

| | | | |
|---|---|---|---|
| 5,992,519 A | 11/1999 | Ramakrishnan et al. |
| 6,035,255 A | 3/2000 | Murphy et al. |
| 6,044,328 A | 3/2000 | Murphy et al. |
| 6,070,125 A | 5/2000 | Murphy et al. |
| 6,219,061 B1 | 4/2001 | Lauer et al. |
| 6,236,994 B1 | 5/2001 | Swartz et al. |
| 6,353,677 B1 | 3/2002 | Pfister et al. |
| 6,373,489 B1 | 4/2002 | Lu et al. |
| 6,490,528 B2 | 12/2002 | Cheng et al. |
| 6,516,274 B2 | 2/2003 | Cheng et al. |
| 6,519,568 B1 | 2/2003 | Harvey et al. |
| 6,549,879 B1 | 4/2003 | Cullick et al. |
| 6,643,656 B2 | 11/2003 | Peterson |
| 6,757,613 B2 | 6/2004 | Chapman et al. |
| 6,765,570 B1 | 7/2004 | Cheung et al. |
| 6,766,254 B1 | 7/2004 | Bradford et al. |
| 6,772,066 B2 | 8/2004 | Cook |
| 6,823,266 B2 | 11/2004 | Czernuszenko et al. |
| 6,826,483 B1 | 11/2004 | Anderson et al. |
| 6,829,570 B1 | 12/2004 | Thambynayagam et al. |
| 6,834,732 B2 | 12/2004 | Haarstad |
| 6,912,467 B2 | 6/2005 | Schuette |
| 6,912,468 B2 | 6/2005 | Marin et al. |
| 6,980,939 B2 | 12/2005 | Dhir et al. |
| 6,980,940 B1 | 12/2005 | Gurpinar et al. |
| 6,993,434 B2 | 1/2006 | Cheng et al. |
| 7,003,439 B2 | 2/2006 | Aldred et al. |
| 7,027,925 B2 | 4/2006 | Terentyev et al. |
| 7,031,842 B1 | 4/2006 | Musat et al. |
| 7,050,953 B2 | 5/2006 | Chiang et al. |
| 7,079,953 B2 | 7/2006 | Thorne et al. |
| 7,096,172 B2 | 8/2006 | Colvin et al. |
| 7,098,908 B2 | 8/2006 | Acosta et al. |
| 7,136,064 B2 | 11/2006 | Zuiderveld |
| 7,181,380 B2 | 2/2007 | Dusterhoft et al. |
| 7,203,342 B2 | 4/2007 | Pedersen |
| 7,248,258 B2 | 7/2007 | Acosta et al. |
| 7,260,508 B2 | 8/2007 | Lim et al. |
| 7,280,932 B2 | 10/2007 | Zoraster et al. |
| 7,281,213 B2 | 10/2007 | Callegari |
| 7,283,941 B2 | 10/2007 | Horowitz et al. |
| 7,298,376 B2 | 11/2007 | Chuter |
| 7,314,588 B2 | 1/2008 | Blankenship |
| 7,330,791 B2 | 2/2008 | Kim et al. |
| 7,337,067 B2 | 2/2008 | Sanstrom |
| 7,362,329 B2 | 4/2008 | Zuiderveld |
| 7,363,866 B2 | 4/2008 | Gnedenko et al. |
| 7,366,616 B2 | 4/2008 | Bennett et al. |
| 7,395,252 B2 | 7/2008 | Anderson et al. |
| 7,409,438 B2 | 8/2008 | McConnell et al. |
| 7,412,363 B2 | 8/2008 | Callegari |
| 7,437,358 B2 | 10/2008 | Arrouye et al. |
| 7,451,066 B2 | 11/2008 | Edwards et al. |
| 7,458,062 B2 | 11/2008 | Coulthard et al. |
| 7,460,957 B2 | 12/2008 | Prange et al. |
| 7,478,024 B2 | 1/2009 | Gurpinar et al. |
| 7,512,543 B2 | 3/2009 | Raghuraman et al. |
| 7,519,976 B2 | 4/2009 | Blevins |
| 7,539,625 B2 | 5/2009 | Klumpen et al. |
| 7,548,873 B2 | 6/2009 | Veeningen et al. |
| 7,565,243 B2 | 7/2009 | Kim et al. |
| 7,576,740 B2 | 8/2009 | Dicken |
| 7,596,481 B2 | 9/2009 | Zamora et al. |
| 7,603,264 B2 | 10/2009 | Zamora et al. |
| 7,606,666 B2 | 10/2009 | Repin et al. |
| 7,612,566 B2 | 11/2009 | Merchant et al. |
| 7,616,213 B2 | 11/2009 | Chuter |
| 7,620,534 B2 | 11/2009 | Pita et al. |
| 7,627,430 B2 | 12/2009 | Hawtin |
| 7,630,872 B2 | 12/2009 | Xia et al. |
| 7,630,914 B2 | 12/2009 | Veeningen et al. |
| 7,652,779 B2 | 1/2010 | Wu et al. |
| 7,657,407 B2 | 2/2010 | Logan |
| 7,657,414 B2 | 2/2010 | Zamora et al. |
| 7,668,700 B2 | 2/2010 | Erignac et al. |
| 7,684,929 B2 | 3/2010 | Prange et al. |
| 7,711,532 B2 | 5/2010 | Dulac et al. |
| 7,711,550 B1 | 5/2010 | Feinberg et al. |
| 7,716,028 B2 | 5/2010 | Montaron et al. |
| 7,725,302 B2 | 5/2010 | Ayan et al. |
| 7,739,089 B2 | 6/2010 | Gurpinar et al. |
| 7,743,006 B2 | 6/2010 | Woronow et al. |
| 7,796,468 B2 | 9/2010 | Kellogg |
| 7,814,989 B2 | 10/2010 | Nikolakis-Mouchas et al. |
| 7,876,705 B2 | 1/2011 | Gurpinar et al. |
| 7,886,285 B2 | 2/2011 | Asselin et al. |
| 7,913,190 B2 | 3/2011 | Grimaud et al. |
| 7,925,483 B2 | 4/2011 | Xia et al. |
| 7,925,695 B2 | 4/2011 | McConnell et al. |
| 7,953,585 B2 | 5/2011 | Gurpinar et al. |
| 7,953,587 B2 | 5/2011 | Bratton et al. |
| 7,970,545 B2 | 6/2011 | Sanstrom |
| 7,986,319 B2 | 7/2011 | Dommisse et al. |
| 7,991,600 B2 | 8/2011 | Callegari |
| 7,995,057 B2 | 8/2011 | Chuter |
| 8,005,658 B2 | 8/2011 | Tilke et al. |
| 8,043,555 B2 | 10/2011 | Smith |
| 8,055,026 B2 | 11/2011 | Pedersen |
| 8,064,684 B2 | 11/2011 | Ratti et al. |
| 8,073,664 B2 | 12/2011 | Schottle et al. |
| 8,094,515 B2 | 1/2012 | Miller et al. |
| 8,103,493 B2 | 1/2012 | Sagert et al. |
| 8,145,464 B2 | 3/2012 | Arnegaard et al. |
| 8,155,942 B2 | 4/2012 | Sarma et al. |
| 8,199,166 B2 | 6/2012 | Repin et al. |
| 8,204,728 B2 | 6/2012 | Schottle et al. |
| 8,249,844 B2 | 8/2012 | Dale et al. |
| 8,259,126 B2 | 9/2012 | Chuter |
| 8,280,635 B2 | 10/2012 | Ella et al. |
| 8,296,720 B2 | 10/2012 | Coulthard et al. |
| 8,301,426 B2 | 10/2012 | Abasov et al. |
| 8,325,179 B2 | 12/2012 | Murray et al. |
| 8,346,695 B2 | 1/2013 | Pepper et al. |
| 8,364,404 B2 | 1/2013 | Legendre et al. |
| 8,381,815 B2 | 2/2013 | Karanikas et al. |
| 8,392,163 B2 | 3/2013 | Liu |
| 8,427,904 B2 | 4/2013 | Miller et al. |
| 8,429,671 B2 | 4/2013 | Wood et al. |
| 8,560,476 B2 | 10/2013 | Anderson et al. |
| 8,578,000 B2 | 11/2013 | Van Wie et al. |
| 8,638,328 B2 | 1/2014 | Lin |
| 8,727,017 B2 | 5/2014 | Hilliard et al. |
| 8,731,872 B2 | 5/2014 | Czernuszenko et al. |
| 8,731,873 B2 | 5/2014 | Walker et al. |
| 8,731,875 B2 | 5/2014 | Hilliard et al. |
| 8,736,600 B2 | 5/2014 | Lin et al. |
| 8,751,208 B2 | 6/2014 | Brouwer et al. |
| 8,797,319 B2 | 8/2014 | Lin |
| 8,803,878 B2 | 8/2014 | Andersen et al. |
| 8,812,334 B2 | 8/2014 | Givens et al. |
| 8,849,639 B2 | 9/2014 | Brown et al. |
| 8,849,640 B2 | 9/2014 | Holl et al. |
| 8,868,540 B2 | 10/2014 | Ture et al. |
| 8,884,964 B2 | 11/2014 | Holl et al. |
| 8,931,580 B2 | 1/2015 | Cheng et al. |
| 9,026,417 B2 | 5/2015 | Sequeira, Jr. et al. |
| 9,123,161 B2 | 9/2015 | Adair et al. |
| 2001/0047245 A1 | 11/2001 | Cheng et al. |
| 2002/0007247 A1 | 1/2002 | Cheng et al. |
| 2002/0049575 A1 | 4/2002 | Jalali et al. |
| 2002/0177955 A1 | 11/2002 | Jalali et al. |

(56) References Cited

U.S. PATENT DOCUMENTS

| | | |
|---|---|---|
| 2004/0012670 A1 | 1/2004 | Zhang |
| 2004/0210395 A1 | 10/2004 | Cheng et al. |
| 2005/0119959 A1 | 6/2005 | Eder |
| 2005/0120242 A1 | 6/2005 | Mayer et al. |
| 2005/0165555 A1 | 7/2005 | Jackson |
| 2005/0171700 A1 | 8/2005 | Dean |
| 2006/0224423 A1 | 10/2006 | Sun et al. |
| 2006/0247903 A1 | 11/2006 | Schottle |
| 2006/0265508 A1 | 11/2006 | Angel et al. |
| 2007/0088707 A1 | 4/2007 | Durgin et al. |
| 2007/0185696 A1 | 8/2007 | Moran et al. |
| 2007/0266082 A1 | 11/2007 | McConnell et al. |
| 2007/0294034 A1 | 12/2007 | Bratton et al. |
| 2008/0088621 A1 | 4/2008 | Grimaud et al. |
| 2008/0165185 A1 | 7/2008 | Smith et al. |
| 2008/0306803 A1 | 12/2008 | Vaal et al. |
| 2009/0027380 A1 | 1/2009 | Rajan et al. |
| 2009/0027385 A1 | 1/2009 | Smith |
| 2009/0037114 A1 | 2/2009 | Peng et al. |
| 2009/0125362 A1 | 5/2009 | Reid et al. |
| 2009/0132170 A1 | 5/2009 | Krueger et al. |
| 2009/0157367 A1 | 6/2009 | Meyer et al. |
| 2009/0182541 A1 | 7/2009 | Crick et al. |
| 2009/0222742 A1 | 9/2009 | Pelton et al. |
| 2009/0229819 A1 | 9/2009 | Repin et al. |
| 2009/0240564 A1 | 9/2009 | Boerries et al. |
| 2009/0295792 A1 | 12/2009 | Liu et al. |
| 2009/0299709 A1 | 12/2009 | Liu |
| 2010/0191516 A1 | 7/2010 | Benish et al. |
| 2010/0206559 A1 | 8/2010 | Sequeira, Jr. et al. |
| 2010/0214870 A1 | 8/2010 | Pepper et al. |
| 2010/0225642 A1 | 9/2010 | Murray et al. |
| 2010/0283788 A1 | 11/2010 | Rothnemer et al. |
| 2011/0029293 A1 | 2/2011 | Petty et al. |
| 2011/0044532 A1 | 2/2011 | Holl et al. |
| 2011/0054857 A1 | 3/2011 | Moguchaya |
| 2011/0063292 A1 | 3/2011 | Holl et al. |
| 2011/0074766 A1 | 3/2011 | Page et al. |
| 2011/0099547 A1 | 4/2011 | Banga |
| 2011/0107246 A1 | 5/2011 | Vik |
| 2011/0109633 A1 | 5/2011 | Sequeira, Jr. et al. |
| 2011/0112802 A1 | 5/2011 | Wilson et al. |
| 2011/0115787 A1 | 5/2011 | Kadlec |
| 2011/0126192 A1 | 5/2011 | Frost et al. |
| 2011/0153300 A1 | 6/2011 | Holl et al. |
| 2011/0161133 A1 | 6/2011 | Staveley et al. |
| 2011/0259598 A1 | 10/2011 | Hilliard et al. |
| 2012/0006560 A1* | 1/2012 | Calvert ............ E21B 43/00 166/369 |
| 2012/0137281 A1 | 5/2012 | Kleiner et al. |
| 2012/0150449 A1 | 6/2012 | Dobin |
| 2012/0166166 A1 | 6/2012 | Czernuszenko |
| 2012/0285701 A1 | 11/2012 | Cheng et al. |
| 2013/0120379 A1* | 5/2013 | Adair ............ G06T 19/00 345/420 |
| 2013/0140037 A1 | 6/2013 | Sequeira, Jr. et al. |
| 2013/0317798 A1 | 11/2013 | Cheng et al. |
| 2014/0365192 A1 | 12/2014 | Cheng et al. |
| 2015/0094994 A1 | 4/2015 | Sequeira, Jr. et al. |
| 2016/0003008 A1 | 1/2016 | Uribe et al. |

FOREIGN PATENT DOCUMENTS

| | | |
|---|---|---|
| WO | WO 2010/053618 | 5/2010 |
| WO | WO 2010/083072 | 7/2010 |

OTHER PUBLICATIONS

Sanstrom, B. et al., (2002), "Innovative 3D visualization tool promotes development-drilling efficiency," *Oil & Gas Journal*, 5 pgs.

Schlumberger (2006), "Contact Maximized in Thin Reservoir," Schlumberger Marketing Communications, 2 pgs.

Bharat, K, et al. (2001), "Who Links to Whom: Mining Linkage Between Web sites", *Proceedings of the 2001 IEE Int'l Conf. on Data Mining*, pp. 51-58.

Cabral, B., et al (1995), "Accelerated Volume Rendering and Tomographic Reconstruction Using Texture Mapping Hardware", *IEEE in Symposium on Volume Visualization*, pp. 91-98, 131.

Crawfis, R., et al. (1992), "Direct Volume Visualization of Three-Dimensional Vector Fields", *Proceedings of the 1992 Workshop on Volume Visualization*, pp. 55-60.

Dhillon, S. (2008), "Managing License Incompatibilities Distributing Eclipse Application Stacks", Thesis, pp. 1-116.

Drebin, R., et al. (1988), "Volume Rendering", *Computer Graphics, The Proceedings of 1988 SIGGRAPH Conference*, vol. 22, No. 4, pp. 65-74.

Lorensen, W., et al., (1987), "Marching Cubes: A High-Resolution 3D Surface Construction Algorithm", *Computer Graphics, The Proceeding of 1987 SIGGRAPH Conference*, vol. 21, No. 4, pp. 163-169.

McCann, P., et al. (2003), "Horizontal Well Path Planning and Correction Using Optimization Techniques, " *J. of Energy Resources Tech*. 123, pp. 187-193.

Mugerin. C., et al. (2002), "Well Design Optimization: Implementation in GOCAD," 22$^{nd}$ Gocade Meeting, Jun. 2002 pp. 1-14.

Rainaud, J.F., et al. (2004), "WOG—Well Optimization by Geosteering: A Pilot Software for Cooperative Modeling on Internet," *Oil & Gas Science & Tech*. 59(4), pp. 427-445.

Reed, P., et al. (2003) "Simplifying Multiobjective Optimization Using Genetic Algorithms," Proceedings of World Water and Environmental Resources Congress, 10 pgs.

Udoh, E., et al. (2003), "Applications of Strategic Optimization Techniques to Development and Management of Oil and Gas Resources", 27$^{th}$ SPE Meeting, 16 pgs.

Touysinhthiphonexay, K., et al. (2002), "Sidetrack Optimization in GOCAD", University of Colorado BP Center for Visualization, Tech21 Limited, Jun. 2002, 4 pgs.

\* cited by examiner

100

400

500

700

SYSTEM AND METHOD FOR PLANNING A WELL PATH

CROSS-REFERENCE TO RELATED APPLICATION

This application is the National Stage entry under 35 U.S.C. 371 of PCT/US2011/042403, that published as WO 2012/027020 and was filed on 29 Jun. 2011, which claims the benefit of U.S. Provisional Application No. 61/376,539, filed on 24 Aug. 2010, each of which is incorporated herein by reference, in its entirety, for all purposes.

FIELD OF THE INVENTION

The present techniques relate to a system and method for providing a physical property model representative of a physical property. In particular, an exemplary embodiment of the present techniques relates to optimizing hydrocarbon well placement in a three-dimensional (3D) environment.

BACKGROUND

This section is intended to introduce various aspects of the art, which may be associated with exemplary embodiments of the present invention. This discussion is believed to assist in providing a framework to facilitate a better understanding of particular aspects of the present invention. Accordingly, it should be understood that this section should be read in this light, and not necessarily as admissions of prior art.

Many applications involve processing information about physical properties. When processing information relating to physical properties of complex systems, it may be desirable to provide a physical property model representative of physical properties that are useful for a specific purpose. These properties may help hydrocarbon exploration professionals to locate hydrocarbon resources in the subsurface of the earth or to improve production of known hydrocarbon resources. Physical properties of hydrocarbon resources may be modeled to assist in the design and placement of wells to extract hydrocarbon resources from the subsurface.

The process of designing a drill well to produce or inject oil, gas, or other fluids involves planning and designing a well path trajectory to optimally produce from or inject into an underground reservoir. Well path planning takes into account many factors in order to meet the objectives of the drilling campaign in a wide range of settings. For example, it may be desirable to determine in an exploration setting whether a target region has particular physical properties that are judged sufficient to justify continuation of an exploration program. In a development setting, a determination may be made regarding whether enough hydrocarbon resources are present such that a proposed well may be exploited commercially. In a production setting, it may be determined whether a proposed well location optimizes recovery or injection volumes and rates.

Other factors that may be considered in well planning include the integrity of the wellbore while drilling and the safety of the drilling crew. As a result, maintaining a minimal distance from identified subsurface objects that could impair drilling performance and safety may be considered in a well planning analysis.

U.S. Patent Application Publication No. 20060151214 by Prange, et al. relates to a method to automatically design a multi-well development plan given a set of previously interpreted subsurface targets. The disclosed method identifies the optimal plan by minimizing the total cost as a function of existing and required new platforms, the number of wells, and the drilling cost of each of the wells. The cost of each well is a function of the well path and the overall complexity of the well.

U.S. Patent Application Publication No. 20060074561 by Xia, et al. relates to a method for displaying a formation model, including displaying a trajectory representing a three-dimensional structure of the wellbore. The disclosed method also includes displaying objects representing a bed boundary along the trajectory. The objects are displayed at distances from the trajectory according to measurement data. In addition, the objects are displayed in orientations reflecting azimuth angles of planes corresponding to the bed boundary.

U.S. Patent Application Publication No. 20070236221 by Merchant, et al. relates to measurements made with a multi-component logging instrument when used in a substantially horizontal borehole in earth formations. The measurements are stated to be diagnostic of the direction of beds relative to the position of the borehole. When the logging instrument is conveyed on a drilling assembly, the drilling trajectory may be maintained to follow a predetermined trajectory or to maintain a desired distance from a boundary such as an oil-water contact.

U.S. Patent Application Publication No. 20050165555 by Jackson relates to a visualization program that is embedded with data that is to be visualized. The disclosed program is restricted to accessing only the data with that is embedded within. The combination of the program and the data may be delivered to an end-user either on a machine-readable medium or by a communication link such as the Internet.

International Patent Application Publication No. WO2005071222 by Sung, et al. relates to an earth model that is formed in real time during drilling of a well by incorporating current knowledge derived from geology, seismic, drilling, and engineering data. The process of forming the model utilizes Logging-While Drilling (LWD) or Measuring-While-Drilling (MWD) data directly from the drilling rig as the well is drilled. The LWD or MWD data is sent to visualization centers and compared with other data such as existing geological models, the proposed well plan and present interpretation of the subsurface stratigraphy. The results of the comparison is said to enable experts to analyze anomalous results and update the geological model within minutes of penetration of a formation during drilling. The disclosure states that well drilling efficiency is improved, and that an "on-the-spot" road map may be provided for maximal reservoir contact and pinpoint accuracy.

U.S. Pat. No. 7,337,067 to Sanstrom discloses a system and method for perceiving drilling learning through visualization is provided. One disclosed system employs three-dimensional visualization of an earth model as a foundation. The disclosure describes a development strategy that focuses on perceiving "Drilling Learning" by an intuitive method. Symbols, known as "Knowledge Attachments" are attached to each wellbore trajectory displayed in the three-dimensional environment, with each symbol indicating a specific event—such as one related to drilling operations or problems. A knowledge attachment system is described as useful to represent disparate data at once, in such a manner that the interdependencies between the earth model and drilling operational data are evident and correlated. Operational issues and lessons learned from prior wells are said to be accessible and perceived in the context of the earth model.

U.S. Pat. No. 7,565,243 to Kim, et al. discloses a method for analyzing the connected quality of a hydrocarbon reservoir. A model of a portion of the reservoir is divided into cells, each cell having a volume and some attributes, and wherein a speed function is assigned to a portion of the cells. A reference cell is chosen. A connectivity between cells in the reservoir is determined by solving an Eikonal equation that describes the travel time propagation, the propagating front progressing outward from a reference cell until an ending condition is met. The Eikonal equation may be solved by a fast marching method with propagation velocity as a function of spatial position being provided by the speed function. Regions of the reservoir are characterized by their connective quality to the reference cell using the connectivity.

U.S. Pat. No. 7,260,508 to Lim discloses a method and system for high-resolution modeling of a well bore in a reservoir. The disclosed method comprises constructing a first unstructured mesh, having a plurality of n-dimensional simplices, corresponding to a first modeled system (space). The method comprises defining a surface bounding a second modeled space and identifying a subset of the plurality of n-dimensional simplices of the first mesh that are intersected by the surface. The subset of simplices are modified so as to adapt the first mesh such that it comprises a second mesh and a third mesh, wherein the second mesh comprises a set of simplices located entirely interior to the surface and wherein the third mesh comprises another set of simplices located entirely exterior to said surface. In this way, it is disclosed that new elements are defined within the intersected elements such that one or more of the faces of the new elements are substantially coincident with the surface (that is, they lie approximately on the surface), and such that some of the new elements lie entirely within the volume defined by said surface, and other elements entirely outside of the volume. More specifically, for each element that is intersected by the surface, a set of points at which the faces, edges or vertices of the element are intersected by the surface is determined (if the element is only intersected at a single point, it need not be subdivided into two or more new elements). At each point of intersection, a new node is created (if the point of intersection is not a node) and two new elements that incorporate the new node are generated. This process is performed for each point of intersection to subdivide the intersected element into a number of new simplex elements, some of which comprise faces that lie substantially on the modeled surface.

SUMMARY

An exemplary embodiment of the present techniques comprises a method for well path planning. An exemplary method comprises defining a proxy constraint volume as a 3D cellular volume where each cell has at least one value derived from data from a 3D earth model. An initial well path is defined within user defined drilling parameter constraints. The exemplary method comprises defining acceptable constraint parameters to be applied to values derived from an intersection of the initial well path and the proxy constraint volume. If the intersection of the initial well path and the proxy constraint volume is not within the acceptable constraint parameters, the initial well path may be iteratively adjusted to create successive well paths until at least one of the successive well paths is within the acceptable constraint parameters for the values derived from the intersection of the well path and proxy constraint volume.

In one exemplary method of well path planning, the proxy constraint volume comprises a distance value for each cell in the volume created by calculating distance from at least one object type defined from the 3D earth model to all cells in the volume. The object type in the proxy constraint distance volume may comprise a fault, a salt formation, a surface, an overpressured zone, an unstable interval or any subsurface object of interest.

Alternatively, the proxy constraint volume may comprise a cost value for each cell in the volume created by associating each cell of the volume with a cost structure for a well path segment intersecting that cell. The proxy constraint volume may specify different costs for different well path orientations and well path deviations from vertical for each path segment.

The proxy constraint volume may comprise a connectivity value for each cell in the volume constructed by assigning connectivity costs for each cell in the volume based of subsurface parameters from the 3D earth model. The proxy constraint volume may specify a degree of connection to other areas of the reservoir derived from properties of the 3D earth model and/or reservoir simulation model. In one exemplary embodiment, each proxy constraint volume has a separate value or range for the constraint parameter.

One exemplary embodiment relates to a method for producing hydrocarbons from an oil and/or gas field using a physical property model representative of a physical property of the oil and/or gas field. This exemplary method comprises defining a proxy constraint volume as a 3D cellular volume where each cell has at least one value derived from data from a 3D earth model representing the oil and/or gas field. An initial well path is defined within user defined drilling parameter constraints. Acceptable constraint parameters are defined. The acceptable constraint parameters may be applied to values derived from an intersection of the initial well path and the proxy constraint volume. The initial well path may be iteratively adjusted to create successive well paths if the intersection of the initial well path and the proxy constraint volume is not within the acceptable constraint parameters. The successive well paths may be evaluated until at least one of them is within the acceptable constraint parameters for the values derived from the intersection of the well path and proxy constraint volume. A corresponding well may then be drilled and hydrocarbons may be extracted from the oil and/or gas field via the drilled well.

In one exemplary method of hydrocarbon production the proxy constraint volume comprises a distance value for each cell in the volume created by calculating distance from at least one object type defined from the 3D earth model to all cells in the volume. The object type in the proxy constraint distance volume may comprise a fault, a salt formation, a surface, an overpressured zone or an unstable interval.

The proxy constraint volume may comprise a cost value for each cell in the volume created by associating each cell of the volume with a cost structure for a well path segment intersecting that cell. Moreover, the proxy constraint volume may specify different costs for different well path orientations and well path deviations from vertical for each path segment.

Alternatively, the proxy constraint volume may comprise a connectivity value for each cell in the volume constructed by assigning connectivity costs for each cell in the volume based of subsurface parameters from the 3D earth model. The proxy constraint volume may specify a degree of connection to other areas of the reservoir derived from properties of the 3D earth model and/or reservoir simulation model. Each proxy constraint volume may have a separate value or range for the constraint parameter.

An exemplary computer system may be adapted to perform a well-planning process. The exemplary computer system may comprise a processor and a non-transitory, computer-readable storage medium that stores computer-readable instructions for execution by the processor. The computer-readable instructions may comprise code that causes the processor to define a proxy constraint volume as a 3D cellular volume where each cell has at least one value derived from data from a 3D earth model and code that causes the processor to define an initial well path within user defined drilling parameter constraints. The computer-readable instructions may also comprise code that causes the processor to define acceptable constraint parameters to be applied to values derived from an intersection of the initial well path and the proxy constraint volume. The computer-readable instructions may additionally comprise code that causes the processor to iteratively adjust the initial well path to create successive well paths if the intersection of the initial well path and the proxy constraint volume is not within the acceptable constraint parameters. The iterative adjustment may be performed until at least one of the successive well paths is within the acceptable constraint parameters for the values derived from the intersection of the well path and proxy constraint volume.

In one exemplary computer system, the proxy constraint volume comprises a distance value for each cell in the volume created by calculating distance from at least one object type defined from the 3D earth model to all cells in the volume. The object type in the proxy constraint distance volume may comprise a fault, a salt formation, a surface, an overpressured zone, an unstable interval or any subsurface object of interest. In another exemplary embodiment, the proxy constraint volume may comprise a cost value for each cell in the volume created by associating each cell of the volume with a cost structure for a well path segment intersecting that cell.

BRIEF DESCRIPTION OF THE DRAWINGS

Advantages of the present techniques may become apparent upon reviewing the following detailed description and drawings of non-limiting examples of embodiments in which.

Figure 1:
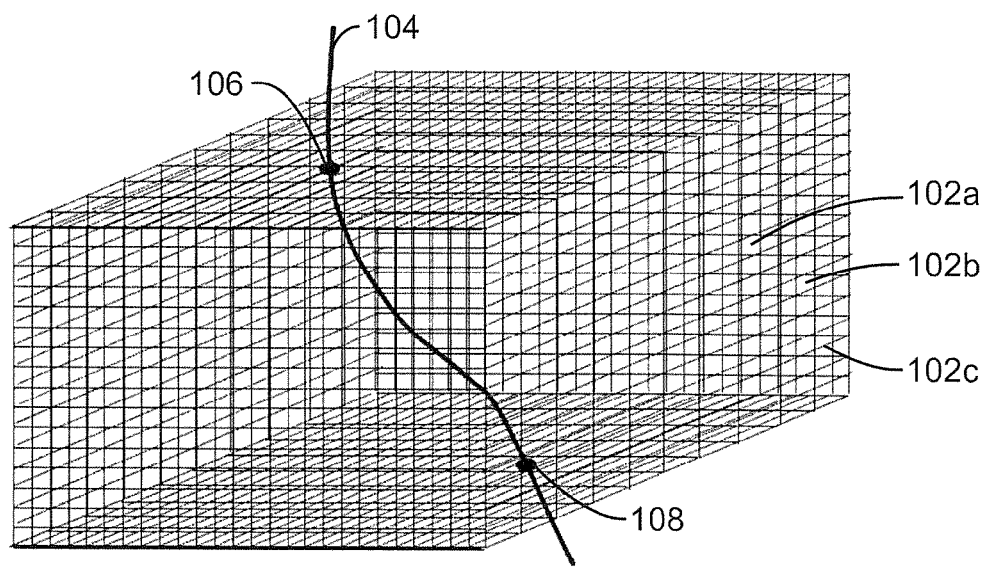
FIG. 1 is a diagram of a data volume representative of a physical property of a subsurface environment.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims. It should also be understood that the drawings are not necessarily to scale, emphasis instead being placed upon clearly illustrating principles of exemplary embodiments of the present invention. Moreover, certain dimensions may be exaggerated to help visually convey such principles.

DETAILED DESCRIPTION

In the following detailed description section, the specific embodiments of the present invention are described in connection with preferred embodiments. However, to the extent that the following description is specific to a particular embodiment or a particular use of the present invention, this is intended to be for exemplary purposes only and simply provides a description of the exemplary embodiments. Accordingly, the invention is not limited to the specific embodiments described below, but rather, it includes all alternatives, modifications, and equivalents falling within the true spirit and scope of the appended claims.

At the outset, and for ease of reference, certain terms used in this application and their meanings as used in this context are set forth. To the extent a term used herein is not defined below, it should be given the broadest definition persons in the pertinent art have given that term as reflected in at least one printed publication or issued patent.

The term "exemplary" is used exclusively herein to mean "serving as an example, instance, or illustration." Any embodiment, method, system or example described herein as "exemplary" is not to be construed as preferred or advantageous over other embodiments, methods, systems or examples.

As used herein, the term "earth model" refers to a geometric model of a portion of the earth that may also contain material properties.

As used herein, the term "property" refers to a characteristic associated with different topological elements on a per element basis.

As used herein, the term "computer component" refers to a computer-related entity, which may include hardware, firmware, software, a combination thereof, or software in execution. For example, a computer component can be, but is not limited to being, a process running on a processor, a processor, an object, an executable, a thread of execution, a program, and/or a computer. One or more computer components can reside within a process and/or thread of execution and a computer component can be localized on one computer and/or distributed between two or more computers.

As used herein, the terms "computer-readable medium", "non-transitory computer-readable medium" or the like refer to any tangible storage that participates in providing instructions to a processor for execution. Such a medium may take many forms, including but not limited to, non-volatile media, and volatile media. Non-volatile media includes, for example, NVRAM, or magnetic or optical disks. Volatile media includes dynamic memory, such as main memory. Computer-readable media may include, for example, a floppy disk, a flexible disk, hard disk, magnetic tape, or any other magnetic medium, magneto-optical medium, a CD-ROM, any other optical medium, a RAM, a PROM, and EPROM, a FLASH-EPROM, a solid state medium like a holographic memory, a memory card, or any other memory chip or cartridge, or any other physical medium from which a computer can read. When the computer-readable media is configured as a database, it is to be understood that the database may be any type of database, such as relational, hierarchical, object-oriented, and/or the like. Accordingly, exemplary embodiments of the present techniques may be considered to include a tangible storage medium or tangible distribution medium and prior art-recognized equivalents and successor media, in which the software implementations embodying the present techniques are stored.

Some portions of the detailed description which follows are presented in terms of procedures, steps, logic blocks, processing and other symbolic representations of operations on data bits within a computer memory. These descriptions and representations are the means used by those skilled in the data processing arts to most effectively convey the substance of their work to others skilled in the art. In the present application, a procedure, step, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions using the terms such as "adjusting", "building", "comparing", "computing", "creating", "defining", "determining", "displaying", "extracting", "identifying", "limiting", "obtaining", "performing", "predicting", "processing", "producing", "providing", "ranking", "selecting", "storing", "transforming", "updating", "deriving", "calculating", "associating", "specifying", "constructing", "assigning", or the like, refer to the action and processes of a computer system, or similar electronic computing device, that transforms data represented as physical (electronic) quantities within the computer system's registers and memories into other data similarly represented as physical quantities within the computer system memories or registers or other such information storage, transmission or display devices. Example methods may be better appreciated with reference to flow diagrams.

While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks. While the figures illustrate various serially occurring actions, it is to be appreciated that various actions could occur concurrently, substantially in parallel, and/or at substantially different points in time.

Current well path planning design practices, whether manual or automatic, employ geometric constraints to calculate the distance to identified subsurface objects the well bore is intended to intersect (targets) or objects the wellbore is intended to avoid (geo-hazards). In addition, current methods calculate permutations of collision avoidance (between other wells or geo-hazards) concurrently with the constraints of penetrating the reservoir targets along the well path. These real-time calculations of important drilling variables used in the well-path planning process are considerable, and except in very simple well designs are so lengthy they eliminate the possibility of having a real-time well planning session with the necessary team of experts (geologists, geophysicists, reservoir engineers, drillers, and production engineers). In accordance with an exemplary embodiment of the present techniques, computing time for well planning may be reduced using existing and/or pre-calculated proxy volumes during the well planning exercise.

Exemplary embodiments of the present techniques also provide real time interactivity for a well planning process. In addition, a wide range of drilling variables may be considered. In particular, an exemplary embodiment relates to a method for evaluating the "goodness" or quality of a well trajectory during the well path planning and screening process by utilizing one or more volume-based objects in a 3D earth environment. Each volume created is a proxy for a drilling variable that can be obtained by extracting the data at an intersection of the well path and a proxy volume. Drilling variables include but are not limited to properties related to oil/gas productivity, drilling cost, path constraints, and/or inter-wells distances between planned wells and/or subsurface objects.

An exemplary embodiment may be suitable for use in connection with an automatic well path optimization process in which evaluating the viability of potential well paths by trial and error is time consuming or may not be possible at all. An exemplary embodiment allows rapid evaluation of many alternative well trajectories and leads to a more optimal solution. Moreover, exemplary embodiments can also be used in an interactive well planning session in which the user can rapidly modify a well path while evaluating the results on the fly, taking into account minimum acceptable distance criteria and safety considerations.

An exemplary embodiment of the present techniques evaluates the distance between a proposed well path and potential obstructions. Such an exemplary embodiment may determine a minimum acceptable distance from specific objects based on a type of object. Moreover, different object types may have differing minimum acceptable distances from a proposed well path. Potential objects to maintain a minimal distance from could include engineering objects (other wellbores etc.), geologic objects (faults, salt bodies etc.), and other identified subsurface objects. If well trajectories are planned and designed in a three-dimensional earth model, identified constraints can be located and evaluated interactively to create an optimal well trajectory or group of optimal trajectories. An exemplary embodiment may be useful in evaluating trade-offs between various well-planning constraints used to arrive at an optimal well trajectory.

FIG. 1 is a diagram of a data volume representative of a physical property of a subsurface environment. The data volume is generally referred to by the reference number 100. The data volume 100 comprises a plurality of cells. Three individual cells 102a, 102b, 102c are identified for purposes of example. In one exemplary embodiment, the cells that make up the data volume 100 are three-dimensional cells organized and arranged in a regularly spaced pattern, for instance, 100 cells by 100 cells by 100 cells. In this example, the data volume 100 would comprise a total of 1,000,000 cells.

In an exemplary embodiment, the data volume 100 represents a 3D earth model having incorporated volumetric data representations. Each of the plurality of cells represents values of one or more physical properties of a subsurface environment modeled by the data volume 100. Moreover, each cell in the data volume 100 may be assigned one or more data values representing the corresponding drilling or subsurface properties at a corresponding subsurface location. One example of a property that may be represented by the cells of the data volume 100 is impedance data in a 3D seismic survey. Other cell-based data can also be incorporated, such as face properties (cell-to-cell), or vector properties to examine attributes such as fluid transmissibility, flow directionality, flow flux, flow rates or any other static or dynamic subsurface property that would benefit the well planning analysis.

A well path 104 is shown as interacting with a plurality of the cells of the data volume 100. An entry point 106 represents a first point of contact between the well path 104 and the data volume 100. An exit point 108 represents a last point of contact between the well path 104 and the data volume 100. As explained herein, an exemplary embodiment of the present techniques allows a user to model different locations for the well path 104 so that minimum distances between a plurality of object types are observed.

Figure 2:
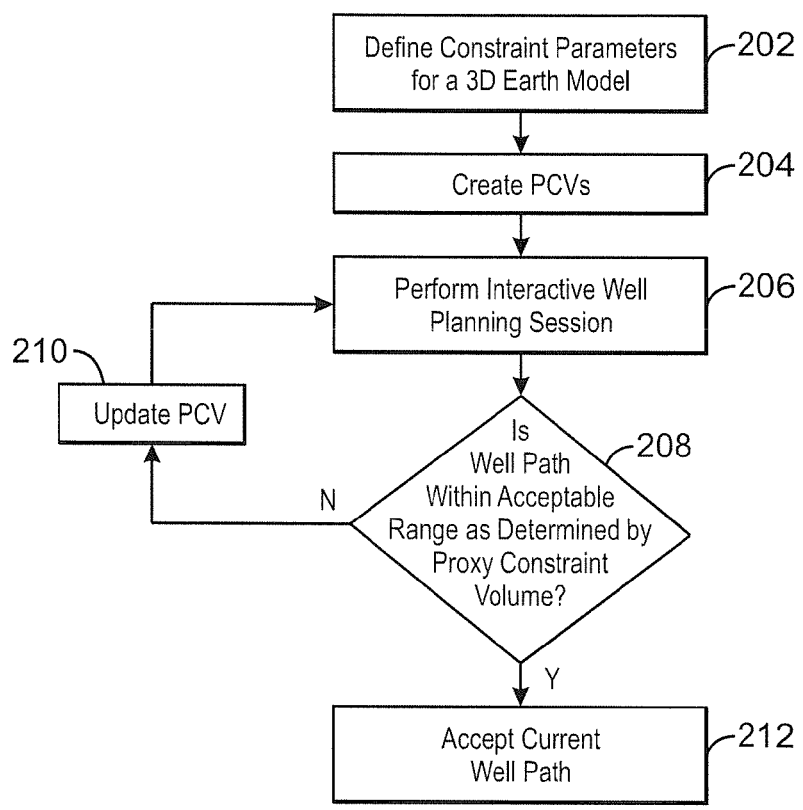
FIG. 2 is a process flow diagram showing a method of planning a location of a well path using a proxy-based constraint model according to an exemplary embodiment of the present techniques.

FIG. 2 is a process flow diagram showing a method of planning a location of a well path using a proxy-based constraint model according to an exemplary embodiment of the present techniques. The method is generally referred to by the reference number 200. Proxy-based methods have been applied in various information or data analysis systems. For example, the internet uses proxies for secure web access. Geoscientists use tree ring or ice cores as proxies to obtain paleo-temperatures of the earth.

Exemplary embodiments of the present techniques apply proxy constraint volumes to a process of well planning. Moreover, exemplary embodiments apply proxy volume constraints to obtain, delegate and/or aggregate information in a uniform manner. The task of well planning may employ the concurrent evaluation of geological and engineering constraints and objectives. Exemplary embodiments utilize a uniform framework of volume-based variables (properties) as proxies to drilling and subsurface constraints to obtain delegated and/or aggregated information from the intersected proxy volume cells in the data volume 100 with a planned well trajectory (indicated by the well path 104 in FIG. 1).

With respect to the exemplary method 200, constraint parameters are defined for a 3D earth model, as shown at block 202. The 3D earth model may include one or more potential reservoirs, all pertinent geologic data (for example, faults, surfaces, salt bodies), and engineering data (for example, wells, reservoir models and properties). These data are used in the well planning process by geologists and engineers to define potential target areas for wellbore placement and geo-hazards for wellbore avoidance. Other information such as ground surface maps for potential drill center locations can also be included in the process. Geological objects are typically identified by geoscientists using interactive interpretation software. Reservoir quality properties such as (net-to-gross/porosity/permeability) may be calculated or derived from seismic data or the geologic/reservoir modeling process using known modeling software.

Constraint parameters may be defined for inclusion in a well-planning process. Examples of possible constraints that may be used for well planning include designing a viable path trajectory based on drilling physics. A drilling constraint such as "maximum dogleg severity" may be used to constrain the degree of well path curvature. Moreover, "maximum dogleg severity" may be used by engineering to determine whether a viable drill well trajectory can be archived. Other drilling parameters such as "hold and curve to target" and "specify angle to target" may be used as constraints for controlling how to steer the well trajectory to the next specified target location along a well path.

In one exemplary embodiment, a constraint parameter represents a minimum acceptable distance to objects of various types. Examples of object types include faults, salt formations, overpressured zones or unstable intervals. As explained herein, a constraint parameter may be defined to allow awareness and avoidance of potential subsurface geo-hazards. Safe distances may be maintained between a planned well path and other planned or existing well paths. Safety constraints such as anti-collision distances may also be used so that safe distances are maintained between objects. Some safe distance constraint examples include "well-to-well," "well-to-fault," "well-to-geo-hazard object," and/or "well surface location to ground objects" distances.

Intervals along a proposed well trajectory may be defined. At these intervals, extracted proxy volume properties for cells may be evaluated to determine whether properties of interest for each cell are within an acceptable range. As explained herein, the acceptable range may be determined using a proxy constraint volume. For a given well planning session, certain reservoir properties may be defined or evaluated. Examples of such properties include pore pressure, fracture gradient, temperature, lithology (sand/shale) and the like. These properties may be evaluated along a proposed well path, not only to ensure the integrity of the well path, but also to provide data for well casing, well completion, and hole integrity.

Well-planning information provided by an exemplary embodiment may allow penetration of acceptable reservoir target areas in which optimal producibility, and reservoir connectivity can be achieved. Reservoir connectivity is an important property for well planning so that optimal producible target volumes can be determined. Reservoir connectivity is typically obtained by static reservoir connectivity analysis based on the boundaries/elevation of reservoir compartments, compartment spill relationships, fluids present (gas/oil/water), and pressures. Other tools using seismic data and/or reservoir models can also be used to determine connection factors between locations in the reservoir.

Constraint parameters may relate to determining well cost to ensure maximum economic benefit and cost saving. The cost of a planned well is typically proportional to the total measured depth of the well. That is, the shorter the total measured depth of the well path the less it will cost. A constraint parameter as described herein may be designed on this basis. Other factors such as calculated "drilling difficulty index (DDI)" based on the geometry of proposed well trajectories may also be considered by engineers in determining well cost. In addition, other cost functions may be used to calculate well cost based on the drill center and geologic formation locations.

Using the defined constraint parameters from block 202, one or more proxy constraint volumes are created, as indicated at block 204. As described herein, a proxy constraint volume may contain data relating to one or more constraint parameters for each cell in the data volume 100. Moreover, the data contained in a proxy constraint volume may be used to determine whether property data in a corresponding cell of the data volume 100 is within an acceptable range specified by one or more constraint parameters. In addition to constraint parameters, proxy constraint volumes may be created using geological, engineering, economic, land, and production information or any other attribute which would be deemed appropriate for a desired well planning analysis.

In an exemplary embodiment, a proxy constraint volume may be a uniform data structure representing an individual volume or multiple volumes of data. Each cell of the proxy constraint volume may contain initial gathered, aggregated and/or derived information such as, but not limited to, reservoir connectivity properties, anti-collision distance attributes between subsurface objects, geologic properties, and/or engineering properties at the geographical location of the cell. An analog would be volumetric data used in geoscience applications such as seismic processing, seismic attribute analysis, as well as geological and reservoir modeling.

As noted, each cell of a property constraint volume may correspond to a cell of the data volume 100. As such, each cell in the volumetric data structure of the proxy constraint volume typically represents a geographic location within the earth. Each cell also possesses data values (as a scale or vector value). To retrieve the data value, one can simply reference the cell location via XYZ indices and/or any other spatial indexing method. In a typical well planning session, the properties along the well path can be obtained and evaluated by retrieving the data values from the intersected cells of a proposed well path such as the well path 104. A proxy constraint volume in accordance with the present techniques may exploit this effective data structure to rapidly evaluate the "goodness" or validity of a well path in a uniform manner enabling the optimization process to evaluate multiple potential well trajectories and reach one or more optimal solutions more efficiently.

One exemplary embodiment of the present techniques relates to the use of one or more proxy constraint volumes to assist in determining a proposed well path that meets corresponding constraint parameter criteria, one of which may be whether a proposed well path is an acceptable distance from one or more object types. The use of the a proxy constraint volume is more efficient than performing an anti-collision analysis with geological objects (faults, surfaces, etc.) using a well-to-object distance calculation to determine whether one or more segments of the proposed well path are too close (e.g., within a user-defined distance) to an object. Moreover, the well-to-object distance calculation typically involves computing the distance between numerous points/segments along the proposed well trajectory and points/segment/faces on the surface. Each calculation requires a relatively large amount of computing time. If the proposed well path is changed (e.g., because an object was too close to a previously proposed well path), the entire well-to-object calculation must be repeated again for each of the points/segments along the well path. In contrast, a proxy constraint volume in accordance with the present techniques translates the entire distance calculation into a distance proxy constraint volume. An example of the use of a distance proxy constraint volume in accordance with the present techniques is explained herein with reference to FIG. 3.

At block 206, an interactive well planning session may be performed using one or more proxy constraint volumes developed at block 204. In the interactive well planning session, a user may select one or more targets (or target areas) in a reservoir, as represented by the data volume 100 (FIG. 1). An initial well path, such as the well path 104, may be chosen based on an initial estimate that is intended to avoid interaction with known geo-hazards. In one example, a well trajectory may be defined to extend from the top surface location to the targets below based on user-defined drilling parameters. Constraint parameters, such as dogleg severity, length of a straight path prior to curving to intersect a target, dip and azimuth, angle into the target etc., are standard parameters to design a drillable well trajectory. Once the well trajectory is created, the constraints and properties along the well trajectory can then extracted from the data volume 100. Values of the relevant proxy constraint volumes are determined based on the extracted data.

One exemplary embodiment relates to a well path optimization process. For well path optimization, a set of conditions and/or constraints for an acceptable well trajectory is defined (block 202). The conditions may include minimizing total drilling costs, and maximizing the well profitability through sufficient hydrocarbon volumes, and production rates, etc. Constraints can include, but are not limited to, minimum distance to certain subsurface structures, minimum distance to other well paths, maximum reach from a drill center, and maximum well inclination, etc. A constraint optimization process is then used to automatically iterate through potential well trajectories based on the given conditions and constraints, as shown by blocks 208 through 212. At each iteration, cells that are intersected by the proposed well trajectory on the given proxy constraint volumes are identified.

At block 208, the proposed well path or trajectory can be rejected, altered or accepted based on the proxy constraint volume data. Moreover, proxy constraint volume data for each iteration may be compared to defined constraint parameter data to determine if one or more elements of proxy constraint volume data is indicative of a condition that exceeds a range set by the constraint parameter data. Criteria for accepting or rejecting a particular well path may include factors such as well performance, well completion strategy, and/or other uncertainty factors based on the existing geologic interpretation and simulation results.

If analysis of the proxy constraint volume data indicates that the initial well path is not within an acceptable range, the location of the well path may be iteratively adjusted to create successive well paths. Revised or updated proxy constraint volumes may be generated for each successive well path, as shown at block 210. If, at block 208, analysis of the proxy constraint volume data indicates that the current iteration of well path data is within an acceptable range, that well path may be accepted, as shown at block 212.

In one exemplary embodiment, a well path optimization process may use the results from the previous iterations to propose a new well trajectory, when appropriate. A stochastic optimization method, such as a genetic algorithm, may randomly select a new trajectory based on the previous iteration by adjusting failed constraint parameters to improve the result. A deterministic optimization method, such as dynamic programming, would evaluate the current trajectory based on the previous iterations to predict the next best solution. The process would gradually converge to one or more optimal well trajectory or set of well trajectories. The use of proxy constraint volumes according to the present techniques may make this automated optimization process more effective and more efficient.

If desired, the user can then use different proxy constraint volumes to further evaluate the "goodness" of the proposed well trajectory. New drilling parameters and/or new surface/target locations can be proposed in this iterative manner until a satisfactory well path is obtained relative to all constraint parameters of interest. An example that shows the use of a proxy constraint volume in a well-planning process is explained herein with reference to FIG. 3.

Figure 3:
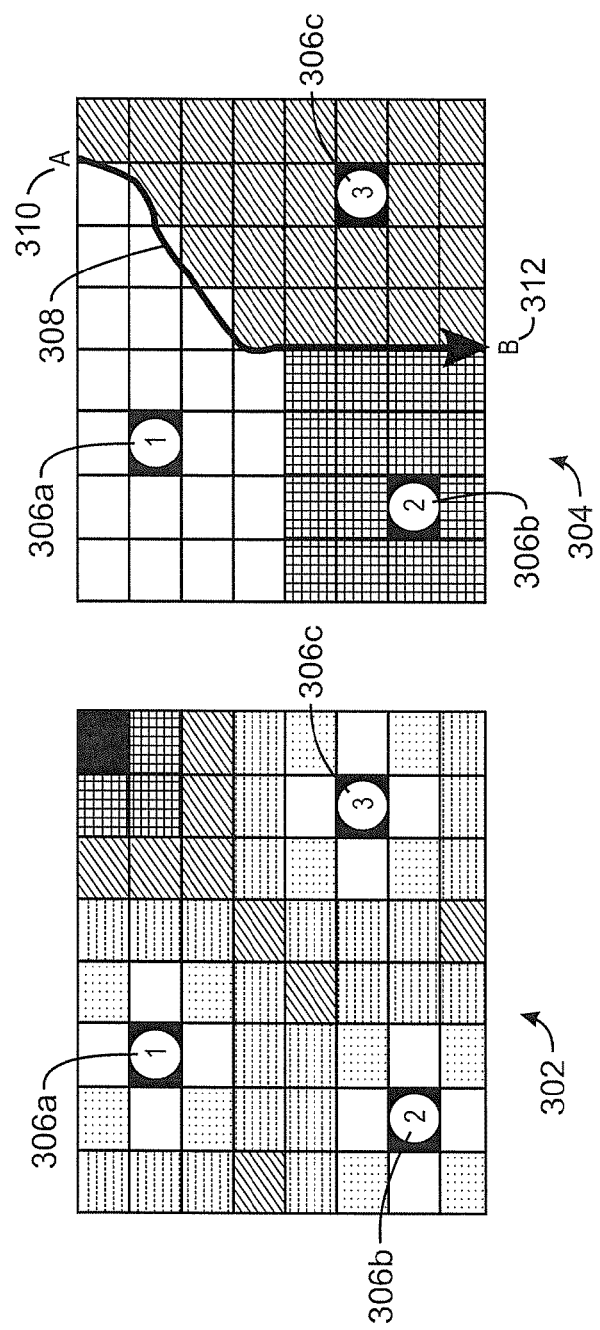
FIG. 3 is a set of graphs that show the use of a distance proxy constraint volume in a well planning process according to an exemplary embodiment of the present techniques.

FIG. 3 is a set of graphs that show the use of a distance proxy constraint volume in a well planning process according to an exemplary embodiment of the present techniques. The set of graphs is generally referred to by the reference number 300. The set of graphs 300 includes a left panel 302 and a right panel 304. The left panel 302 shows a grid that is representative of a subsurface region divided into a plurality of cells. Geo-hazard objects 306a, 306b and 306c are dispersed at various locations around the grid. The geo-hazard objects 306a, 306b and 306c may be of different types, as discussed herein.

The cells of the grid are either solidly filled, unfilled (empty) or hatched to indicate a shortest distance to the geo-hazard objects 306a, 306b and 306c. Solidly filled cells are located the farthest distance from all of the geo-hazard objects 306a, 306b and 306c. Unfilled cells are located the shortest distance from at least one of the geo-hazard objects 306a, 306b and 306c. Cells having cross-hatching are located at intermediate distances (relative to filled and unfilled cells) from the geo-hazard objects 306a, 306b and 306c.

The right panel 304 also shows the geo-hazard objects 306a, 306b and 306c. In addition, a proposed well path 308 is shown. The well path 308 enters the region shown in the right panel 304 at an entry point 310 and exits the region at an exit point 312.

The right panel 304 illustrates the use of a distance proxy constraint volume to perform an anti-collision analysis as part of a well-planning process. Moreover, a distance proxy constraint volume may be used to determine whether or not any one location along the proposed well path 308 is unacceptably close (i.e., closer than a user-defined constraint parameter) to any of the geo-hazards 306a, 306b and 306c. The well path 308 has been chosen (for example, as a result of an iterative well-planning process as described herein with reference to FIG. 2) to maintain a maximum distance from all three geo-hazard objects 306a, 306b and 306c.

The shading of the cells in the right panel 304 represents distance proxy constraint volume values indicative of the distance between each cell in the right panel 304 and selected geo-hazard objects intersecting the volume. Moreover, the data values for each cell represent distance from that cell's location to the closest cell occupied by any one of the geo-hazard objects 306a, 306b and 306c. In an exemplary embodiment, each cell may record one distance value for each object type. Thus, if the geo-hazard objects 306a, 306b and 306c are each of a different object type, a distance proxy constraint object may contain three values: one for a distance from each of the three object types. Selectable object types include, but are not limited to, salt bodies, faults, and existing well trajectories.

To determine if a planned well trajectory is too close to certain objects imbedded in a distance proxy constraint volume, one can retrieve intersected cell values along the well trajectories. The value in each one of the intersected cells represents the closest distance value to objects in the model. If any one of the cell values, which is essentially the shortest distance from this path location to one or more objects, is smaller than the user defined minimum anti-collision distance (a defined constraint parameter), the well trajectory may be rejected.

Since, during a well planning session, most of the geological objects to avoid do not change position, the distance proxy constraint values can be calculated once at the beginning of a well planning session for all of those objects. The distance proxy constraint value only needs to be updated if an existing well is added to the system and well-to-well anti-collision analysis is of desired.

As explained herein, a distance proxy constraint volume can be used for the real-time evaluation of anti-collision constraints during the well planning process. Especially where an optimization algorithm is used, the distance proxy constraint volume significantly outperforms a traditional geometry point-to-point distance calculation in terms of run-time.

Another advantage of the use of proxy constraint volumes according to the present techniques, including the distance proxy constraint volume discussed with reference to FIG. 3, is that the creation of the data volume can be done in parallel. That is, values for each cell in the proxy constraint volume can be calculated utilizing high performance parallel processors, graphics cards and advances in algorithms. For instance, the distance proxy constraint volume can take advantage of various distance transforms, e.g., the chamfer method, vector-based transform or Eikonal solvers. This process can be used at the beginning of the well planning session or can be applied to update the Distance PCV while a new well path has been planned and added to the 3D earth model. Use of high performance parallel processors and algorithms may allow the well plan optimization processes to be conducted in real time.

Figure 4:
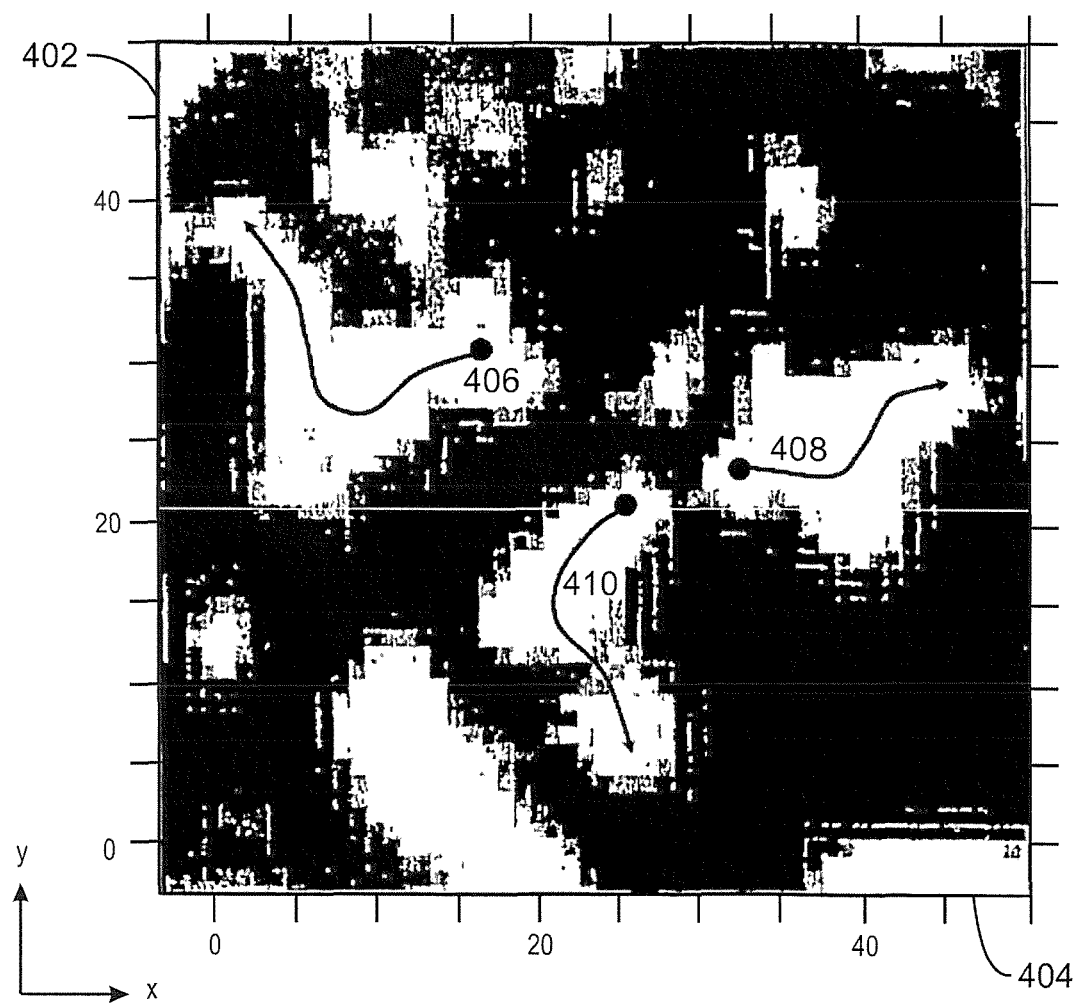
FIG. 4 is a graph that shows the use of a connectivity proxy constraint volume in a well planning process according to an exemplary embodiment of the present techniques.

FIG. 4 is a graph that shows the use of a connectivity proxy constraint volume in a well planning process according to an exemplary embodiment of the present techniques. The graph is generally referred to by the reference number 400. The graph 400 shows a y-axis 402, which represents distance in units of meters. Also shown is an x-axis 404, which represents distance in units of meters. The graph 400 represents a cross-section of a portion of a subsurface environment. Each grid element indicated by the y-axis 402 and the x-axis 404 represents an individual cell.

Understanding connectivity between compartments in a reservoir may perform an important role in planning the location and direction of a well path within the reservoir. This analysis typically requires advanced reservoir simulation and/or a reservoir connectivity analysis. An exemplary embodiment may provide an interactive well-planning and/or optimization process in which it is possible to obtain useful connectivity data in real time.

During a well planning session, a connectivity proxy component volume may be constructed according to the principles set forth herein. Connectivity proxy component volume data may be used to guide the trajectory of the proposed well path so that it intersects the connected hydrocarbon bearing cells in such a way that the hydrocarbon volume stored in the connected cells is maximized to support the cost of drilling the exploration, development or production well. In the graph 400, poorly connected reservoir areas are represented by darker shades and the highly connected reservoir areas by lighter shades. Three proposed well penetration locations are represented as points 406, 408, and 410. Lighter shades at all three penetration points, as well as the optimum connection path emanating from these points, suggest these locations will likely penetrate and produce hydrocarbons from highly connected reservoir segments.

According to the present techniques, a connectivity proxy constraint volume may be created by aggregating the connectivity analysis and simulation results (flow properties) as a quantitative measurement, namely the connectivity quality, of the reservoir. Moreover, it may be possible to represent aggregated information in a uniform manner that allows the well planning session to rapidly evaluate the "pay off" and quality of potential well locations.

As shown in FIG. 4, a connectivity proxy constraint volume may be represented such that each cell in the volume records values to characterize the reservoir connectivity quality. The connectivity for cells in the reservoir may be determined by solving a wave propagation equation, outward from a reference cell until an ending condition is met. The end-result of this method provides a connectivity quality value for each cell shown in FIG. 4. The described method is but one example of calculating connectivity quality.

Figure 5:
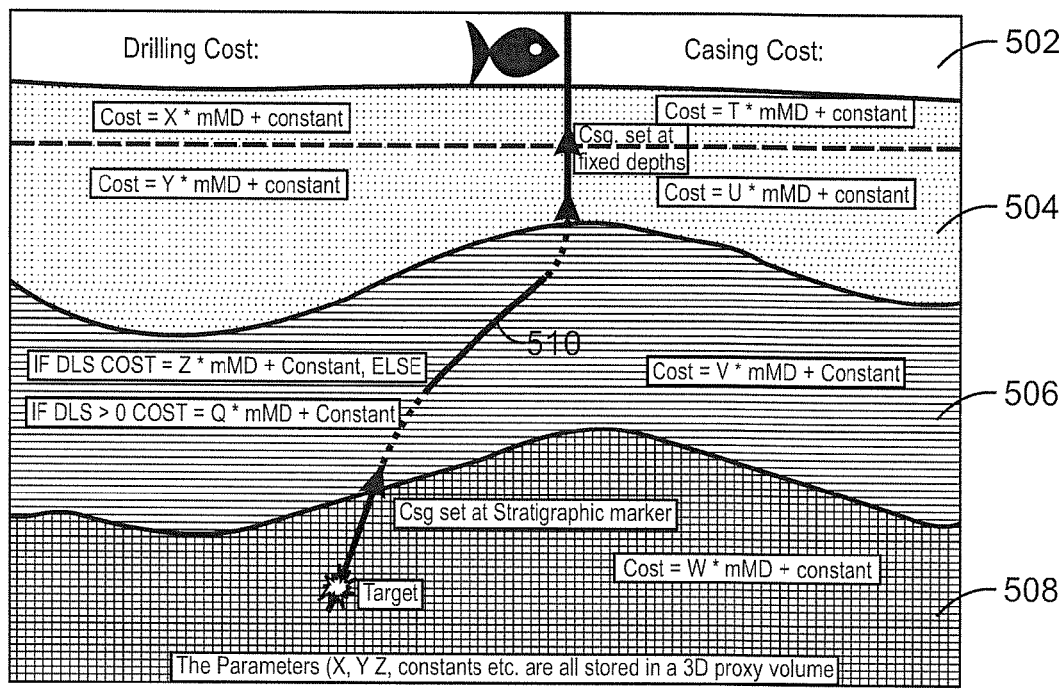
FIG. 5 is a diagram that shows the use of a well cost proxy constraint volume in a well planning process according to an exemplary embodiment of the present techniques.

FIG. 5 is a diagram that shows the use of a well cost proxy constraint volume in a well planning process according to an exemplary embodiment of the present techniques. The diagram is generally referred to by the reference number 500. The diagram 500 shows a cross-section through a three-dimensional geologic model. A water zone 502, a first subsurface zone 504, a second subsurface zone 506 and a third subsurface zone 508 are depicted. Each of the subsurface zones 504, 506, 508 may comprise different rock types.

An objective of well planning optimization is to find an optimal well trajectory such that the drilling cost is minimized and while meeting all of the subsurface objectives (e.g., constraint parameters). In a well-planning session, the typical cost to drill a well is usually considered to be related to the total length of a well trajectory. A simple cost function can be represented as dollars per measured depth drilled. Thus, the total measured depth from the surface location to the end of well trajectory can easily be obtained and a dollar value applied to calculate total well cost. Additional cost calculations could include measurements such as drilling difficulty related to the curvature and depth of the well path or other cost functions related to drilling physics. These measurements are all related to the geometry of a well trajectory and the difficulty to actually drill the path. None of these cost methods directly takes into account the geological and/or the geophysical properties the well path will drill through, such as rock type, rock properties, rock thickness, and/or geologic drilling hazards encountered. An exemplary embodiment provides a robust and flexible cost measurement method that includes the geological/or the geophysical properties. Such an exemplary embodiment may be performed using a cost proxy constraint volume. An exemplary embodiment may also take into account costs associated with the drilling physics (curvature, total depth etc.).

The diagram 500 shows an exemplary scenario in which a cost proxy constraint volume may be created. Each cell in the three-dimensional volume (such as the data volume 100 shown in FIG. 1) is assigned the necessary information to represent the cost to place a well trajectory through each cell. Some costs are taken to be constant, such as cost per length of casing, drilling rig day rate, etc. Other costs are considered to be variable depending upon location, materials used, and estimated drill time. To get the total cost to drill the well each different drilling segment is calculated, and then they are all summed.

In the diagram 500, a proposed drill well 510 is represented as a black line. To calculate the cost to drill the well, there are two cost categories: materials and time. Materials relate to the equipment use to drill and complete the well (casing, tubing, drilling mud, etc.). Time is directly proportional to the complexity of the well path and the difficulty of drilling through the Earth's layers. For each of these two general categories, there is an example formula to calculate the well cost shown by the general mathematical equation Cost=mx+k, where m equals variables and k equals a constant. The coefficients m and k vary with changes in drilling parameters such as, but not restricted to, rock type, rock hardness, well diameter, drilling difficulty, well angle, etc. In this simplified example, eight different formulas from the four intervals (502, 504, 506, 508) are used to describe a three-dimensional drill well cost proxy constraint volume to calculate the drill well cost estimate.

In a well planning session involving a proposed deep well, a more complex well path, and drilling through more complex or unknown geology, it may be desirable to use additional well cost variables to describe the cost proxy constraint volume, thus making the proxy volume more complex but more robust for the drilling difficulty and uncertainty. Even though this proxy constraint volume is more complex, it could be created and used following the same principles described in the previous example.

Figure 6:
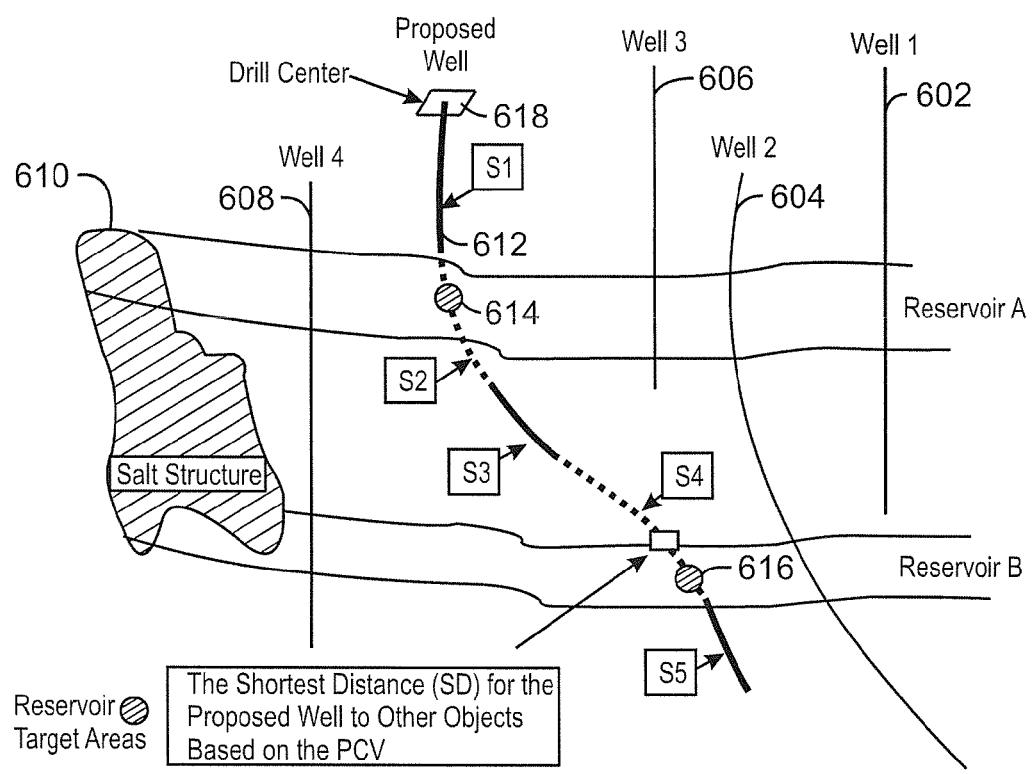
FIG. 6 is a diagram that shows the use of a well planning optimization in two stacked reservoirs and two targets according to an exemplary embodiment of the present techniques.

FIG. 6 is a diagram that shows the use of a well planning optimization in two stacked reservoirs and two targets according to an exemplary embodiment of the present techniques. The diagram is generally referred to by the reference number 600. The diagram 600 shows a portion of a subsurface region in which hydrocarbon exploration is taking place. A plurality of existing wells 602, 604, 606, 610 are shown, as is a salt structure 610. It is desirable to avoid these obstacles when planning the location of a new well. A proposed well path 612 is also shown in FIG. 6.

The exemplary well-planning problem represented by the diagram 600 relates to optimizing a well path for two stacked reservoirs using only anti-collision constraints and a cost function based on the total measured depth and geometry of the planned well. Cost is increased for curved sections of the well path.

Two targets or target areas 614 and 616 are desired intersections for the proposed 612. The target area 614 is in reservoir A and the target area 616 is in reservoir B. For anti-collision analysis, a distance proxy constraint volume was created using information about the previously planned wells 602, 604, 606, 608 and the salt structure 610. Minimum distances to the existing well paths 602, 604, 606, 608 and the salt structure 610 are calculated and stored in cells representing locations in a 3D volume representing the distance proxy constraint volume.

For purposes of illustration, let $S_i$ denote each unique path segment in the well trajectory such that the entire well can be represented by a sequence of $S_i$, where either $S_i$ is either a straight segment or a curved segment. As shown in the diagram 600, an instance of the proposed new well trajectory 612 consists of five path segments, S1, S2, S3, S4 and S5. The solid line segments (S1, S3, and S5) are straight trajectory sections and the dashed line segments, S2 and S4 are the curved trajectory sections in the proposed well path 612.

It may also be assumed that the cost to drill a well segment is proportional to the length of a path segment with an additional cost applied for each curved path segment. A calculation may be performed to get the cost to drill the well in this example.

In an exemplary embodiment, an objective of a well-planning optimization process is to find a well trajectory such that the following criteria are met:
1. Minimize the cost of the well trajectories, where total cost=sum of costs related to i-th segments along the well path, for I=1 to N; where N is the number of path segments along the well trajectory.
2. All locations along the well trajectory should maintain a minimum distance of 100 ft. to all existing wells and, 100 ft. from the salt structure boundary.

In an exemplary well-planning process, a distance proxy constraint volume is created to encompass the area of interest. Each cell is first initialized with a null value. The next step is to intersect the existing well paths and the salt structure into the cells of the distance proxy constraint volume. In the example shown in FIG. 6, all cells along the well paths and cells within the salt structure would have a zero distance value. An iterative calculation is then conducted to fill all the null value cells with the distance to the closest zero value cells. Once the distance proxy constraint volume is created, the optimization process may first propose a new well trajectory starting from one of the available slot locations in a drill center 618. The well path segments are created based on defined drilling algorithms and pre-set constraints. The path should pass through the top and base of the targeted reservoir areas 614, 616. All the cells intersected by the well path can then be identified. The shortest distance, denoted as SD, to any one of the anti-collision objects can be obtained via the minimum distance values of all the intersected cells. The location in which the SD occurs at the top of reservoir B is shown as a box on the proposed well path 612.

If the value of SD is less than 100 ft, then the well trajectory is invalid and should be adjusted based on the segments containing this SD value. If no well path segment adjustment can satisfy the anti-collision constraint, a new well trajectory is proposed by changing the surface location and/or path segments on the targeted areas until a valid well trajectory is obtained. Once a valid well trajectory is obtained, the total cost of the well trajectory can then be calculated. The same process could be repeated for fixed number of iterations or until the optimization analysis has converged. Each iteration would base on the previous iterations to fine tune the well trajectory until a valid well trajectory with optimal cost is obtained.

One extension from this example is that the cost calculation formula could be replaced by a cost proxy constraint volume. This would allow a more detailed cost estimate based on other geologic parameters in addition to costs associated solely to the well path geometry.

Figure 7:
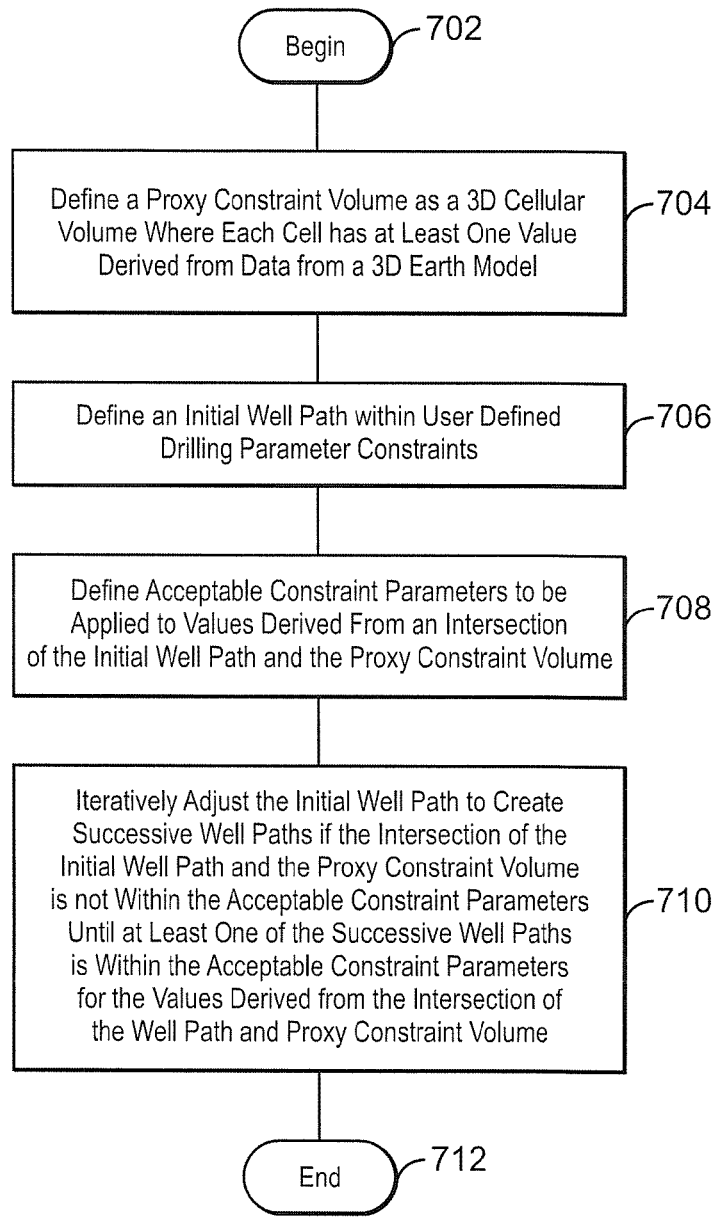
FIG. 7 is a process flow diagram showing a method for performing a well-planning process, in accordance with an exemplary embodiment of the present techniques.

FIG. 7 is a process flow diagram showing a method for performing a well-planning process, in accordance with an exemplary embodiment of the present techniques. The process is generally referred to by the reference number 700. The well-planning process may take into account properties that are relevant to the production of hydrocarbon resources, such as object avoidance, connectivity or well cost. The process 700 may be executed using one or more computer components of the type described herein with reference to FIG. 9. Such computer components may comprise one or more non-transitory, computer-readable medium that stores computer-executable instructions. The process 700 begins at block 702.

At block 704, a proxy constraint volume is defined as a 3D cellular volume where each cell has at least one value derived from data from a 3D earth model. An initial well path may be defined within user defined drilling parameter constraints, as shown at block 706. Acceptable constraint parameters may be defined, as shown at block 708. The acceptable constraint parameters may be applied to values derived from an intersection of the initial well path and the proxy constraint volume. As explained herein, the acceptable constraint parameters may relate to a wide range of properties of interest, such as the location of subsurface objects, connectivity and cost of production, to name just a few examples.

In one exemplary embodiment, the proxy constraint volume comprises a distance value for each cell in the volume created by calculating distance from at least one object type defined from the 3D earth model to all cells in the volume. Examples of object types may include a fault, a salt formation, a surface, an overpressured zone, an unstable interval or any subsurface object of interest.

The initial well path may be evaluated to determine whether it is within the acceptable constraint parameters. The initial well path may be iteratively adjusted to create successive well paths if the intersection of the initial well path and the proxy constraint volume is not within the acceptable constraint parameters. This iterative adjustment may be performed until one or more well paths that meet the acceptable constraint parameters derived from the intersection of the well path and proxy constraint volume are identified, as shown at block 710. At block 712, the process ends.

Figure 8:
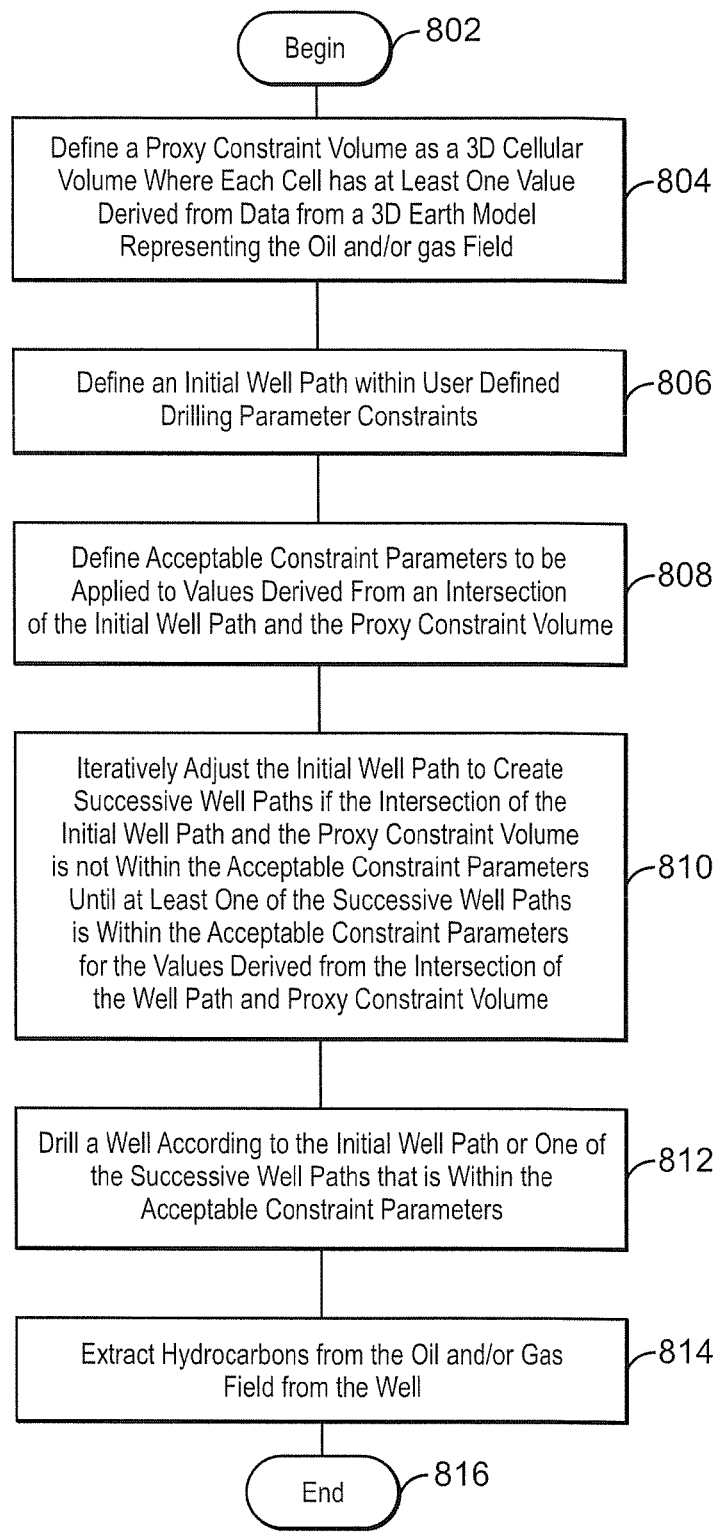
FIG. 8 is a process flow diagram showing a method for producing hydrocarbons from a subsurface region such as an oil and/or gas field according to exemplary embodiments of the present techniques.

FIG. 8 is a process flow diagram showing a method for producing hydrocarbons from a subsurface region such as an oil and/or gas field according to exemplary embodiments of the present techniques. The process is generally referred to by the reference number 800. According to an exemplary embodiment of the present techniques, hydrocarbon production is facilitated through the use of a data model representative of a physical property. The data model may comprise a 3D earth model.

Those of ordinary skill in the art will appreciate that the present techniques may facilitate the production of hydrocarbons by producing visualizations that allow geologists, engineers and the like to determine a course of action to take to enhance hydrocarbon production from a subsurface region. By way of example, a visualization produced according to an exemplary embodiment of the present techniques may allow an engineer or geologist to determine a well placement to increase production of hydrocarbons from a subsurface region. At block 802, the process begins.

At block 804, a proxy constraint volume is defined as a 3D cellular volume where each cell has at least one value derived from data from a 3D earth model representing the oil and/or gas field. An initial well path is defined within user defined drilling parameter constraints, as shown at block 806. Acceptable constraint parameters are defined, as shown at block 808. The acceptable constraint parameters may be applied to values derived from an intersection of the initial well path and the proxy constraint volume.

As shown at block 810, the initial well path may be iteratively adjusted to create successive well paths. Iterative adjustment as described herein may be performed if the intersection of the initial well path and the proxy constraint volume is not within the acceptable constraint parameters. Moreover, new successive well paths may be created and evaluated until at least one of the successive well paths is within the acceptable constraint parameters for the values derived from the intersection of the well path and proxy constraint volume.

Those of ordinary skill in the art will appreciate that a plurality of successive well paths may be evaluated and multiple well paths may be within the acceptable constraint parameters. After this evaluation is performed, one or more wells corresponding to well paths that are within the acceptable constraint parameters may be drilled, as shown at block 812. Hydrocarbons may be extracted from the drilled well(s), as shown at block 814. At block 816, the process ends.

Figure 9:
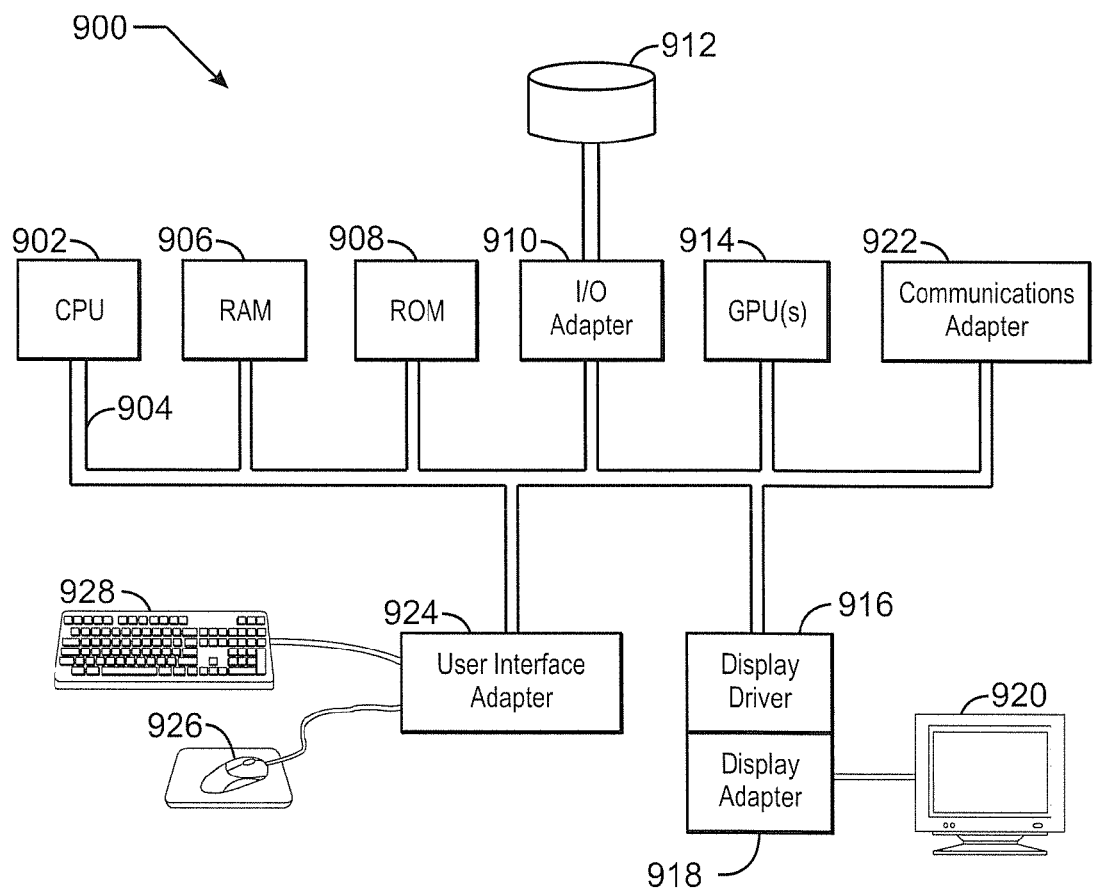
FIG. 9 is a block diagram of a computer system that may be used to perform a method for performing a well planning process according to exemplary embodiments of the present techniques.

FIG. 9 is a block diagram of a computer system that may be used to perform a method for performing a well planning process according to exemplary embodiments of the present techniques. The computer network is generally referred to by the reference number 900. A central processing unit (CPU) 902 is coupled to system bus 904. The CPU 902 may be any general-purpose CPU, although other types of architectures of CPU 902 (or other components of exemplary system 900) may be used as long as CPU 902 (and other components of system 900) supports the inventive operations as described herein. Those of ordinary skill in the art will appreciate that, while only a single CPU 902 is shown in FIG. 9, additional CPUs may be present. Moreover, the computer system 900 may comprise a networked, multi-processor computer system. The CPU 902 may execute the various logical instructions according to various exemplary embodiments. For example, the CPU 902 may execute machine-level instructions for performing processing according to the operational flow described above in conjunction with FIG. 7 or FIG. 8.

The computer system 900 may also include computer components such as computer-readable media. Examples of computer-readable media include a random access memory (RAM) 906, which may be SRAM, DRAM, SDRAM, or the like. The computer system 900 may also include additional computer-readable media such as a read-only memory (ROM) 908, which may be PROM, EPROM, EEPROM, or the like. RAM 906 and ROM 908 hold user and system data and programs, as is known in the art. The computer system 900 may also include an input/output (I/O) adapter 910, a communications adapter 922, a user interface adapter 924, and a display adapter 918. In an exemplary embodiment of the present techniques, the display adapted 918 may be adapted to provide a 3D representation of a 3D earth model. Moreover, an exemplary embodiment of the display adapter 918 may comprise a visualization engine or VE that is adapted to provide a visualization of extracted data. The I/O adapter 910, the user interface adapter 924, and/or communications adapter 922 may, in certain embodiments, enable a user to interact with computer system 900 in order to input information.

The I/O adapter 910 preferably connects a storage device(s) 912, such as one or more of hard drive, compact disc (CD) drive, floppy disk drive, tape drive, etc. to computer system 900. The storage device(s) may be used when RAM 906 is insufficient for the memory requirements associated with storing data for operations of embodiments of the present techniques. The data storage of the computer system 900 may be used for storing information and/or other data used or generated as disclosed herein.

The computer system 900 may comprise one or more graphics processing units (GPU(s)) 914 to perform graphics processing. Moreover, the GPU(s) 914 may be adapted to provide a visualization useful in performing a well planning process according to the present techniques. The GPU(s) 914 may communicate via a display driver 916 with a display adapter 918. The display adapter 918 may produce a visualization on a display device 920. Moreover, the display device 920 may be used to display information or a representation pertaining to a portion of a subsurface region under analysis, such as displaying a generated well path, according to certain exemplary embodiments.

A user interface adapter 924 may be used to couple user input devices. For example, the user interface adapter 924 may connect devices such as a pointing device 926, a keyboard 928, and/or output devices to the computer system 900.

The architecture of system 900 may be varied as desired. For example, any suitable processor-based device may be used, including without limitation personal computers, laptop computers, computer workstations, and multi-processor servers. Moreover, embodiments may be implemented on application specific integrated circuits (ASICs) or very large scale integrated (VLSI) circuits. In fact, persons of ordinary skill in the art may use any number of suitable structures capable of executing logical operations according to the embodiments.

The proxy constraint volumes described herein are but a few examples of how a uniform volumetric data construction can be used to assemble information to assist a well planning process. Exemplary embodiments of the present techniques are thus useful for well planning optimization, in which the evaluation of conflicting constraints (cost vs. payoff) could be done in a much more effective manner.

The present techniques may be susceptible to various modifications and alternative forms, and the exemplary embodiments discussed above have been shown only by way of example. However, the present techniques are not intended to be limited to the particular embodiments disclosed herein. Indeed, the present techniques include all alternatives, modifications, and equivalents falling within the spirit and scope of the appended claims.

What is claimed is:

1. A method for planning a well path, comprising:
defining a proxy constraint volume as a three-dimensional (3D) cellular volume having one or more cells, where each cell has at least one value derived from data from a 3D earth model;
defining an initial well path within user defined drilling parameter constraints;
defining acceptable constraint parameters to be applied to values derived from an intersection of the initial well path and the proxy constraint volume;
if the intersection of the initial well path and the proxy constraint volume is within the acceptable constraint parameters, indicating the initial well path is within the acceptable constraint parameters; and
if the intersection of the initial well path and the proxy constraint volume is not within the acceptable constraint parameters, iteratively adjusting the initial well path to create successive well paths until at least one of the successive well paths is within the acceptable constraint parameters for the values derived from the intersection of the well path and proxy constraint volume.

2. The method recited in claim 1, wherein the proxy constraint volume comprises a distance value for each cell in the volume created by calculating distance from at least one object type defined from the 3D earth model to the all cells in the volume.

3. The method recited in claim 2, wherein the at least one object type in the proxy constraint distance volume comprises a fault, a salt formation, a surface, an overpressured zone, an unstable interval, a planned or existing well, a seismic derived object, or object of interest.

4. The method recited in claim 1, wherein the proxy constraint volume comprises a cost value for each cell in the volume created by associating each cell of the volume with a cost structure for a well path segment intersecting that cell.

5. The method recited in claim 4, wherein the proxy constraint volume specifies different costs for different well path orientations and well path deviations from vertical for the well path segment.

6. The method recited in claim 1, wherein the proxy constraint volume comprises a connectivity value for each cell in the volume constructed by assigning connectivity costs for each cell in the volume based of subsurface parameters from the 3D earth model.

7. The method recited in claim 6, wherein the proxy constraint volume specifies a degree of connection to other areas of a reservoir derived from properties of one of the 3D earth model, reservoir simulation model or any combination thereof.

8. The method recited in claim 1, wherein the proxy constraint volume has a separate value or range for the constraint parameter.

9. A method for producing hydrocarbons from a hydrocarbon field using a physical property model representative of a physical property of the hydrocarbon field, the method comprising:
defining a proxy constraint volume as a three-dimensional (3D) cellular volume having one or more cells, where each cell has at least one value derived from data from a 3D earth model representing the hydrocarbon field;
defining an initial well path within user defined drilling parameter constraints;
defining acceptable constraint parameters to be applied to values derived from an intersection of the initial well path and the proxy constraint volume;
if the intersection of the initial well path and the proxy constraint volume is within the acceptable constraint parameters, indicating the initial well path is within the acceptable constraint parameters; and
if the intersection of the initial well path and the proxy constraint volume is not within the acceptable constraint parameters, iteratively adjusting the initial well path to create successive well paths until at least one of the successive well paths is within the acceptable constraint parameters for the values derived from the intersection of the well path and proxy constraint volume;
drilling a well according to the initial well path or one of the successive well paths that is within the acceptable constraint parameters; and
extracting hydrocarbons from the hydrocarbon field from the well.

10. The method recited in claim 9, wherein the proxy constraint volume comprises a distance value for each cell in the volume created by calculating distance from at least one object type defined from the 3D earth model to all cells in the volume.

11. The method recited in claim 10, wherein the at least one object type in the proxy constraint distance volume comprises a fault, a salt formation, a surface, an overpressured zone, an unstable interval, a planned or existing well, a seismic derived object, or object of interest.

12. The method recited in claim 9, wherein the proxy constraint volume comprises a cost value for each cell in the volume created by associating each cell of the volume with a cost structure for a well path segment intersecting that cell.

13. The method recited in claim 12, wherein the proxy constraint volume specifies different costs for different well path orientations and well path deviations from vertical for the well path segment.

14. The method recited in claim 9, wherein the proxy constraint volume comprises a connectivity value for each cell in the volume constructed by assigning connectivity costs for each cell in the volume based of subsurface parameters from the 3D earth model.

15. The method recited in claim 14, wherein the proxy constraint volume specifies a degree of connection to other areas of a reservoir derived from properties of one of the 3D earth model, reservoir simulation model or any combination thereof.

16. The method recited in claim 9, wherein the proxy constraint volume has a separate value or range for the constraint parameter.

17. A computer system that is adapted to perform a well-planning process, the computer system comprising:
a processor; and
a non-transitory, computer-readable storage medium that stores computer-readable instructions for execution by the processor, the computer-readable instructions comprising:
code that, when executed by the processor, is adapted to cause the processor to define a proxy constraint volume as a three-dimensional (3D) cellular volume having one or more cells, where each cell has at least one value derived from data from a 3D earth model;
code that, when executed by the processor, is adapted to define an initial well path within user defined drilling parameter constraints;
code that, when executed by the processor, is adapted to cause the processor to define acceptable constraint parameters to be applied to values derived from an intersection of the initial well path and the proxy constraint volume;
code that, when executed by the processor, is adapted to cause the processor to, if the intersection of the initial well path and the proxy constraint volume is within the acceptable constraint parameters, indicate the initial well path is within the acceptable constraint parameters; and
code that, when executed by the processor, is adapted to cause the processor to, if the intersection of the initial well path and the proxy constraint volume is not within the acceptable constraint parameters, iteratively adjust the initial well path to create successive well paths until at least one of the successive well paths is within the acceptable constraint parameters for the values derived from the intersection of the well path and proxy constraint volume.

18. The computer system recited in claim 17, wherein the proxy constraint volume comprises a distance value for each cell in the volume created by calculating distance from at least one object type defined from the 3D earth model to all cells in the volume.

19. The computer system recited in claim 18, wherein the at least one object type in the proxy constraint distance volume comprises a fault, a salt formation, a surface, an overpressured zone, an unstable interval, a planned or existing well, a seismic derived object, or object of interest.

20. The computer system recited in claim 17, wherein the proxy constraint volume comprises a cost value for each cell in the volume created by associating each cell of the volume with a cost structure for a well path segment intersecting that cell.

* * * * *